(12) United States Patent
Steenbruggen et al.

(10) Patent No.: US 8,153,480 B2
(45) Date of Patent: Apr. 10, 2012

(54) AIR CAVITY PACKAGE FOR FLIP-CHIP

(75) Inventors: Geert Steenbruggen, Wamel (NL); Paul Dijkstra, Eindhoven (NL)

(73) Assignee: NXP B.V., Eindhoven (NL)

( * ) Notice: Subject to any disclaimer, the term of this patent is extended or adjusted under 35 U.S.C. 154(b) by 734 days.

(21) Appl. No.: 11/996,322

(22) PCT Filed: Jul. 24, 2006

(86) PCT No.: PCT/IB2006/052533
§ 371 (c)(1),
(2), (4) Date: Nov. 13, 2008

(87) PCT Pub. No.: WO2007/013024
PCT Pub. Date: Feb. 1, 2007

(65) Prior Publication Data
US 2009/0079050 A1    Mar. 26, 2009

Related U.S. Application Data

(60) Provisional application No. 60/702,569, filed on Jul. 25, 2005.

(51) Int. Cl.
*H01L 21/44* (2006.01)
*H01L 23/28* (2006.01)

(52) U.S. Cl. ........ 438/127; 438/108; 438/123; 257/778; 257/787; 257/666; 257/E23.039; 257/E21.503

(58) Field of Classification Search ............ 257/666, 257/778, E23.039, E23.031; 438/108, 123, 438/127
See application file for complete search history.

(56) References Cited

U.S. PATENT DOCUMENTS

| | | | |
|---|---|---|---|
| 4,710,798 A | | 12/1987 | Marcantonio |
| 5,656,550 A | * | 8/1997 | Tsuji et al. ............... 438/123 |
| 6,140,144 A | * | 10/2000 | Najafi et al. ............... 438/53 |
| 6,288,905 B1 | * | 9/2001 | Chung ............... 361/771 |
| 6,414,849 B1 | * | 7/2002 | Chiu ............... 361/760 |
| 6,787,916 B2 | * | 9/2004 | Halahan ............... 257/777 |
| 7,067,357 B2 | * | 6/2006 | Terui et al. ............... 438/123 |
| 7,105,931 B2 | * | 9/2006 | Attarwala ............... 257/783 |
| 7,176,582 B2 | | 2/2007 | Kloen |

(Continued)

FOREIGN PATENT DOCUMENTS

JP    05291319 A    11/1993

(Continued)

*Primary Examiner* — Nitin Parekh
(74) *Attorney, Agent, or Firm* — Peter Zawilski

(57) ABSTRACT

According to an example embodiment, there is method (100) for manufacturing a semiconductor device in an air-cavity package. For a device die having an active surface, a lead frame is provided (5), the lead frame has a top-side surface and an under-side surface, the lead frame has predetermined pad landings on the top-side surface. A laminate material is applied (10) to the top-side surface of the lead frame. In the laminate material, an air-cavity region and contact regions are defined (15, 20, 25, 30, 35). The contact regions provide electrical connections to the predetermined pad landings on the lead frame. With the active circuit surface in an orientation toward the laminate material, the device die is mounted (40, 45). The bond pads of the active surface circuit are connected with ball bonds to the predetermined pad landings on the lead frame. An air-cavity is formed between the active surface of the device die and the top-side surface of the lead frame.

14 Claims, 4 Drawing Sheets

U.S. PATENT DOCUMENTS

| | | |
|---|---|---|
| 7,247,938 B2 | 7/2007 | Groenhuis et al. |
| 2002/0030258 A1* | 3/2002 | Fukasawa et al. ............ 257/678 |
| 2002/0135064 A1* | 9/2002 | Hazeyama et al. ............ 257/737 |
| 2003/0193096 A1* | 10/2003 | Tao et al. ...................... 257/786 |
| 2005/0258548 A1* | 11/2005 | Ogawa et al. ................. 257/778 |
| 2007/0102826 A1* | 5/2007 | Meyer-Berg et al. ......... 257/778 |

FOREIGN PATENT DOCUMENTS

| | | |
|---|---|---|
| JP | 11026645 A | 1/1999 |
| WO | 03085728 A1 | 10/2003 |
| WO | 03085731 A1 | 10/2003 |

* cited by examiner

AIR CAVITY PACKAGE FOR FLIP-CHIP

The invention relates to integrated circuit (IC) packaging. More particularly this invention relates to forming of an air cavity in the vicinity to an IC die to provide for improved device performance.

The electronics industry continues to rely upon advances in semiconductor technology to realize higher-function devices in more compact areas. For many applications realizing higher-functioning devices requires integrating a large number of electronic devices into a single silicon wafer. As the number of electronic devices per given area of the silicon wafer increases, the manufacturing process becomes more difficult.

Many varieties of semiconductor devices have been manufactured with various applications in numerous disciplines. Such silicon-based semiconductor devices often include metal-oxide-semiconductor field-effect transistors (MOSFET), such as p-channel MOS (PMOS), n-channel MOS (NMOS) and complementary MOS (CMOS) transistors, bipolar transistors, BiCMOS transistors. Such MOSFET devices include an insulating material between a conductive gate and silicon-like substrate; therefore, these devices are generally referred to as IGFETs (insulated-gate FET).

Each of these semiconductor devices generally includes a semiconductor substrate on which a number of active devices are formed. The particular structure of a given active device can vary between device types. For example, in MOS transistors, an active device generally includes source and drain regions and a gate electrode that modulates current between the source and drain regions.

Furthermore, such devices may be digital or analog devices produced in a number of wafer fabrication processes, for example, CMOS, BiCMOS, Bipolar, etc. The substrates may be silicon, gallium arsenide (GaAs) or other substrate suitable for building microelectronic circuits thereon.

After undergoing the process of fabrication, the silicon wafer has a predetermined number of devices. These devices are tested. Good devices are collected and packaged.

The packaging of complex IC devices is increasingly playing a role in its ultimate performance. In high-frequency RF circuits, capacitance significantly affects the behavior of the devices. In an example situation, for circuits (fabricated in 1 μm technology) in the 1980s, the time constant for interconnect was considerably faster than the MOS switching time. For 100 nm technology, the RC delay for copper and low-k dielectric interconnects ($\in_{dielectric}$=2.0) is about 30 ps for a 1 mm long interconnect. This compares to only 5 ps required for changing the state of the transistor. As the technology is advancing, the situation has become more alarming. For example, in 35 nm technology, the MOS FET switching delay decreases to about 2.5 ps, whereas the RC-delay for a 1 mm long global interconnect increases to about 250 ps.

The packaging must be suitable for the demands of modern technology. An example package that is suitable for high performance devices, may be found in International Application published under the Patent Cooperation Treaty (PCT) titled, "Semiconductor Device and Method of Manufacturing Same," of Kloen et al. (International Publication Number, WO 03/085731, Publication Date: 16 Oct. 2003) and in U.S. patent application Ser. No. 10/510,591 filed on Oct. 8, 2004 now granted U.S. Pat. No. 7,176,582 issued on Feb. 13, 2007 titled, "Semiconductor Device and Method of Manufacturing Same," of the same inventors. This package is a known as a thin universal leadless industrial package (i.e., TULIP). Another example package may be found in International Application published under the PCT titled, "Carrier, Method of Manufacturing a Carrier and an Electronic Device," of Groenhuis et al. (International Publication Number, WO 03/085728, Publication Date: 16 Oct. 2003) and in U.S. patent application Ser. No. 10/510,588 filed on Oct. 8, 2004 now granted U.S. Pat. No. 7,247,938 issued on Jul. 24, 2007 titled, "Carrier, Method of Manufacturing a Carrier and an Electronic Device," of the same inventors. These references are incorporated by reference in their entirety.

To meet the challenge of the faster technology, even more low-k dielectrics are required. Surrounding the IC die with air rather than molding compounds reduces the capacitance of the metal interconnects to a low limit.

There is a need for a technique to take advantage of the properties of air and applying the attributes of modern packaging of high performance IC devices.

This invention has been found useful for in constructing an air cavity within a package for placing an IC device die therein. The lead frame may be constructed by the techniques cited in Kloen et al. or Groenhuis et al. or other suitable techniques. The finished IC has the die in a flip-chip orientation.

In example embodiment according to the present invention, there is a method for manufacturing a semiconductor device in an air-cavity package; the semiconductor device includes a device die, the device die having an active circuit surface and a back surface, the active circuit surface having bond pads. The method comprises, providing a lead frame; the lead frame has a top-side surface and an under-side surface, the lead frame has predetermined pad landings on the top-side surface. To the top-side surface of the lead frame a laminate material is applied. An air-cavity region and contact regions in the laminate material is defined. The contact regions provide electrical connections to the predetermined pad landings on the lead frame. With the active circuit surface in an orientation toward the laminate material the device die is mounted. The bond pads of the active circuit surface are connected with ball bonds to the predetermined pad landings on the lead frame. An air-cavity is formed between active circuit surface of the device die and the top-side surface of the lead frame. A further feature of this embodiment is that the device die is encapsulated in a passivating envelope and the lead frame includes recesses, the recesses provide mechanical connection for either the laminate material or encapsulating material.

In another example embodiment, a semiconductor device comprises, a carrier with a first and a second side situated opposite to each other; the carrier has a first conductive layer on the first side. The first conductive layer is patterned in a predetermined pattern, thereby defining a number of mutually isolated connection conductors, wherein on the second side, contact surfaces are defined in the connection conductors for placement on a substrate. There is a layer of laminating material on the first side of the carrier. The laminating material has contact regions corresponding to the number of and to the predetermined pattern of the mutually isolated connection conductors and the layer of laminating material has an air-cavity region defined therein. A device die is situated over the air-cavity region of the layer of laminating material; the device die has bonding pads electrically coupled with bumps to the connection conductors of the carrier through the contact regions. The bumps also attach the device die onto the carrier, The layer of laminating material extends as far as the carrier wherein the layer of laminating material is mechanically anchored in side faces having recesses defined in the connection conductors. In a passivating envelope that extends as far as the carrier over the layer of laminating material, the device die is encapsulated. The passivating envelope bonds to the layer of laminating material.

In yet another embodiment, of the present invention, there is a method for packaging a plurality of device chips on a semiconductor wafer, the semiconductor device including a device chip, the device chip having an active circuit surface and a back surface, the active circuit surface having bond pads. The method comprises providing a plurality of lead frames, the lead frames having top-side surfaces and underside surfaces, the lead frames having predetermined pad landings on the top-side surfaces, the plurality of lead frames encompassing the plurality of device chips on the semiconductor wafer, the plurality of lead frames having boundary regions defining single packaged devices. To the top-side surfaces of the plurality of lead frames a laminate material is applied. Air cavity regions and contact regions are defined in the laminate material, the contact regions providing electrical connections to the predetermined pad landings on the lead frames. The semiconductor substrate having the plurality of device chips with the active circuit surfaces in an orientation toward the laminate material is mounted to the laminate material, connecting the bond pads of the active circuit surfaces with ball bonds to the predetermined pad landings on the lead frames. The active circuit surfaces of the device chips and the top-side surfaces of the lead frames form an air-cavities therebetween. With a passivating envelope, the semiconductor substrate is map molded. The underside surfaces of the plurality of lead frames are back etched so that electrical connections remain. After back-etch, the plurality of device chips are separated at the boundary regions. A feature of this embodiment is that the lead frames further include side faces. The side faces have recesses that facilitate the mechanical anchoring of the laminate material applied to the lead frames.

The above summaries of the present invention are not intended to represent each disclosed embodiment, or every aspect, of the present invention. Other aspects and example embodiments are provided in the figures and the detailed description that follows.

The invention may be more completely understood in consideration of the following detailed description of various embodiments of the invention in connection with the accompanying drawings, in which.

Figure 1:
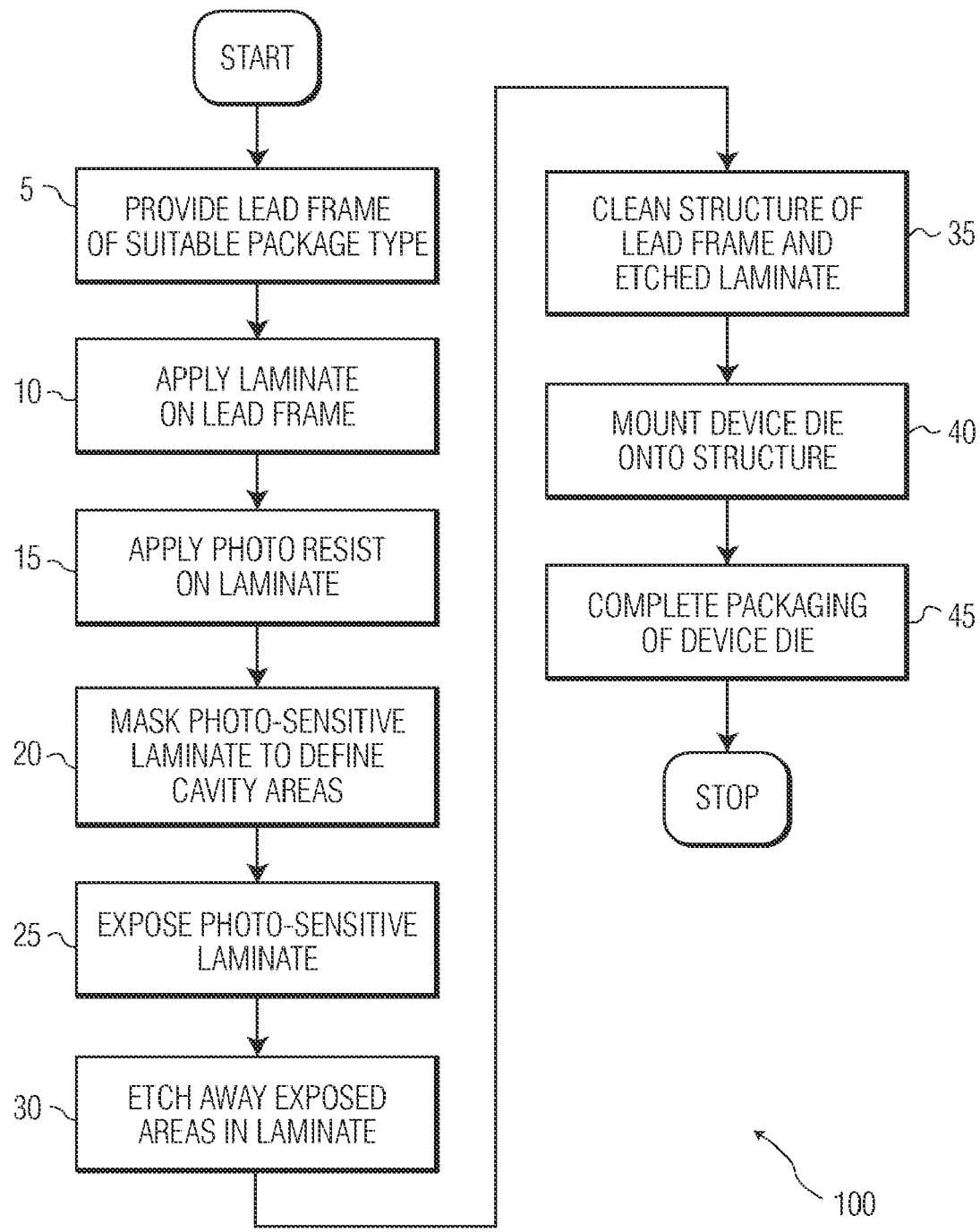
FIG. 1 is a flowchart of a method of making an air-cavity package according to an embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

The present invention has been found to be useful in defining flip-chip packaging having an air cavity above the die. Laminate material on a carrier has a cavity defined therein to realize an air-cavity above the die that is ultimately packaged. The air cavity realized is particularly suited for BAW (bulk acoustic wave) filter applications in RF circuits. Furthermore, in other applications where a lower-k dielectric is useful, the air cavity package fulfills the need.

In an example embodiment, a lead frame constructed by technology, such as described in Kloen et al. supra, may be used. The lead frame includes three layers of different material, for example copper, aluminum or a nickel-iron alloy. Having different layers allows for selective etching of a given layer. For example, three layers may include copper, nickel, and copper. Alternatively, the carrier may include a layer of copper, aluminum, and another layer of copper. However, the lead frame choice is not necessarily limited to any particular type only that the chosen lead frame be compatible with the device die and subsequent application.

Refer to FIG. 1. In an example embodiment 100, for a given device application a lead frame of a suitable package type is provided 5. A laminate material is applied to the lead frame 10. Such a laminate may include, but is not limited to polyimide resins. In a photo-lithographic process, photo resist is applied to the laminate material 15. Areas of laminate to be etched are masked. Such areas include a region to define the air cavity areas 20. The resist-coated laminate is exposed 25. Exposed areas in the laminate are etched away 30. After etching, the structure of the lead frame and laminate is cleaned 35. Upon the cleaned structure, the device die is mounted 40. In an example process, the device die may be in a flip-chip orientation, i.e., the device die's circuit is mounted face down into the package in which an air cavity has been defined 40. Ball bonds are mounted in predetermined areas defined on the lead frame 210. The mounted device die, lead frame, and laminate are encapsulated. Often in the aforementioned process, multiple devices may be arranged on a lead frame array that has been coated with laminate material and having had air-cavity regions defined. These multiple devices are mounted, encapsulated, and separated into individual packaged product.

In another example embodiment, the laminate material 15 applied on the lead frame 10 may itself have photo-resist-like properties. After masking 20 and exposure 25, selected areas may be removed 30. The laminate material 15 is then cured. Thus, the application of laminate on the lead frame 10 and followed by the application of photo resist 15 upon the laminate is eliminated.

Figure 2A:
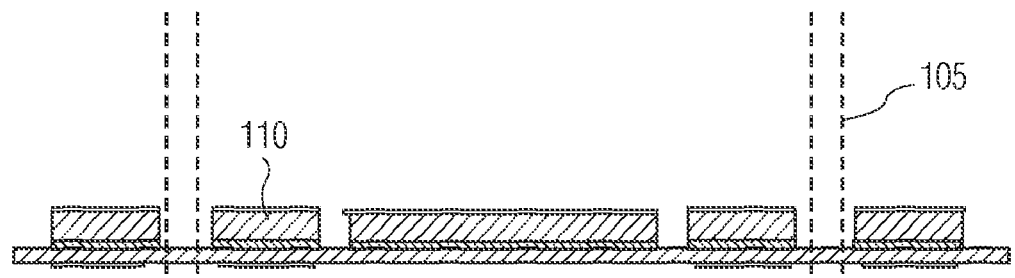
FIGS. 2A-2F depicts in cross-section the packaging of a flip-chip die with an air cavity according to an embodiment of the present invention.
Figure 2B:
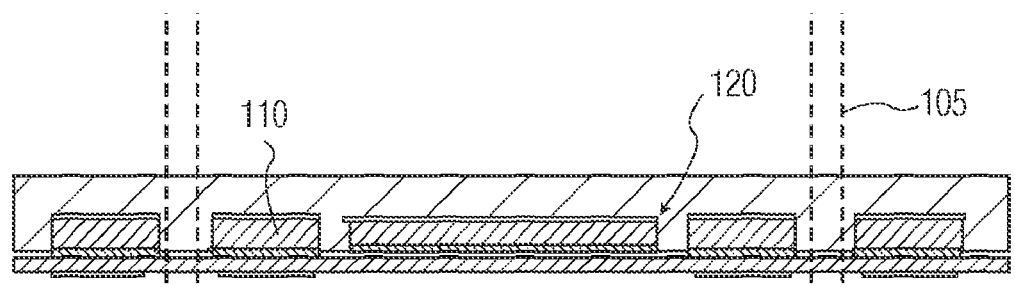
Figure 2C:
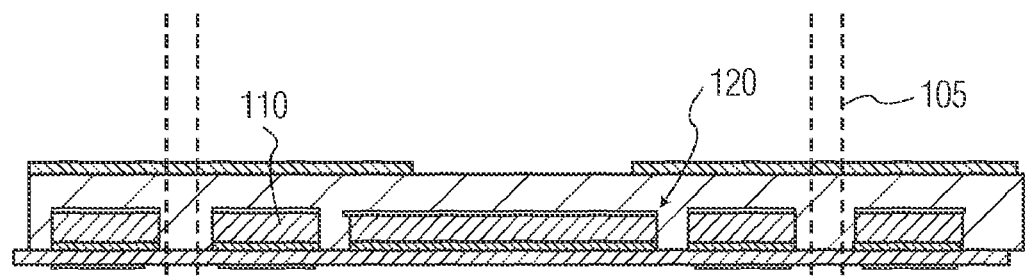
Figure 2D:
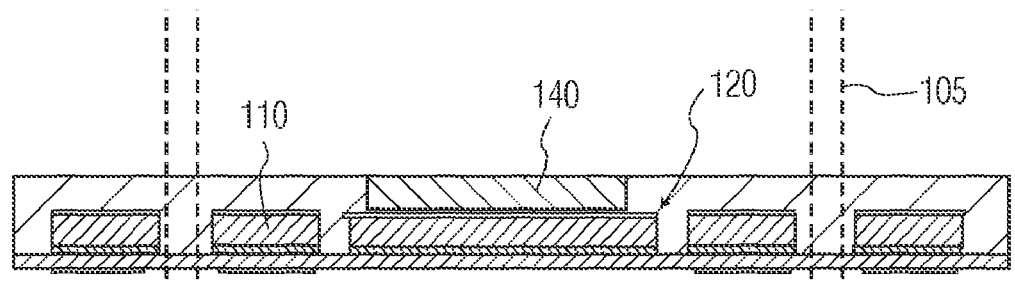
Figure 2E:
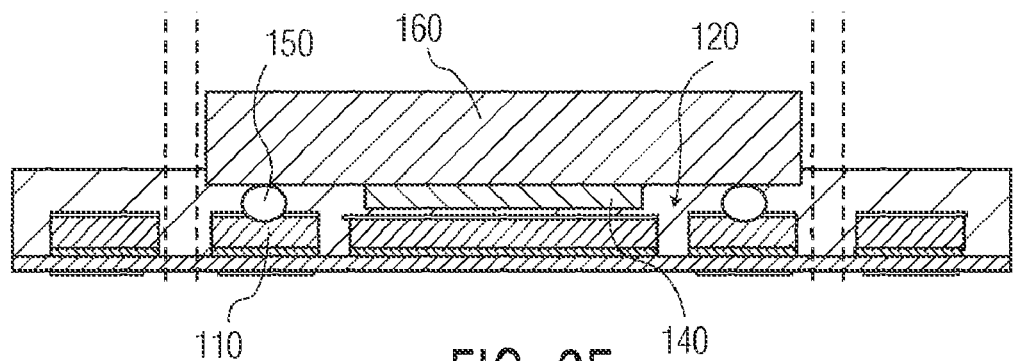
Figure 2F:
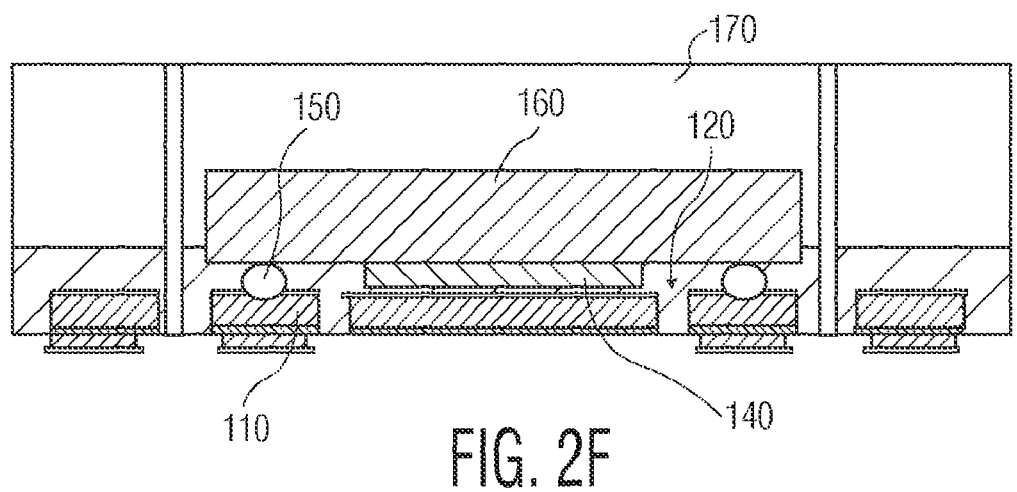

Refer to FIGS. 2A-2F. An example embodiment of packaging a device according to the present invention is shown in a series of side views. FIG. 2A depicts a lead frame 110. Dashed line 105 depicts a boundary in which adjacent lead frames are separated. Separation may be done with a diamond saw or other slicing technique. In arraying the lead frames 110, multiple die may be processed simultaneously with resulting increases in efficiencies and decreases of costs. FIG. 2B depicts the application of the laminate material 120. Photo resist is applied on the laminate material 120. Shown in FIG. 2C, mask 130 defines the region (through photo lithography) in which the air-cavity is opened. As depicted in FIG. 2D, after etching by the example process 100, an air-cavity 140 is opened. In FIG. 2E, device die 160 is flip-chip bonded to connections defined on the lead frame 110 through ball bonds 150. FIG. 2F shows device die 160 encapsulated (i.e., map molded) with a suitable material 170. Map molding is used for over-molding an array of devices with one mold cap. The devices formed in an array are singulated (separated) into individual devices in a later process. The lead frame 110 is back etched to create the individual devices to form solder landings and to create a saw lane having no copper.

The multiple die 160 the lead frame 110 array, the completed devices are separated at boundaries 105a where the saw lanes have been defined. The separation may be accomplished through sawing or other suitable methods.

Figure 3:
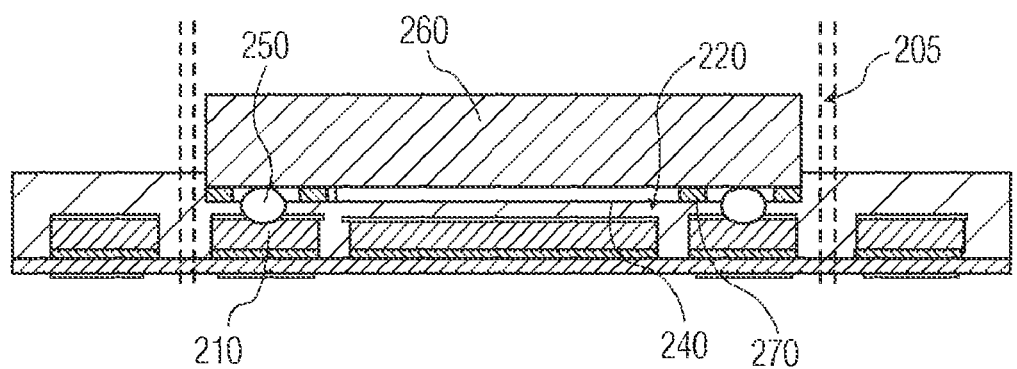
FIG. 3 depicts in cross-section section the packaging of a flip-chip die at the wafer-level according to another embodiment of the present invention.

Refer to FIG. 3. In another example embodiment according to the present invention, solder resist 270 is applied on the lead frame 210. Slots and the air cavity 240 are defined through photo-lithography. After defining the slots are the air cavity 240, the device die 260 is attached to the lead frame 210 with ball bonds 250. Completed devices are separated at boundaries 205. In an example process, the saw lane at boundaries 205 is about 50 μm. The pitch of devices in the array is about die size plus the saw lane.

Figure 4A:
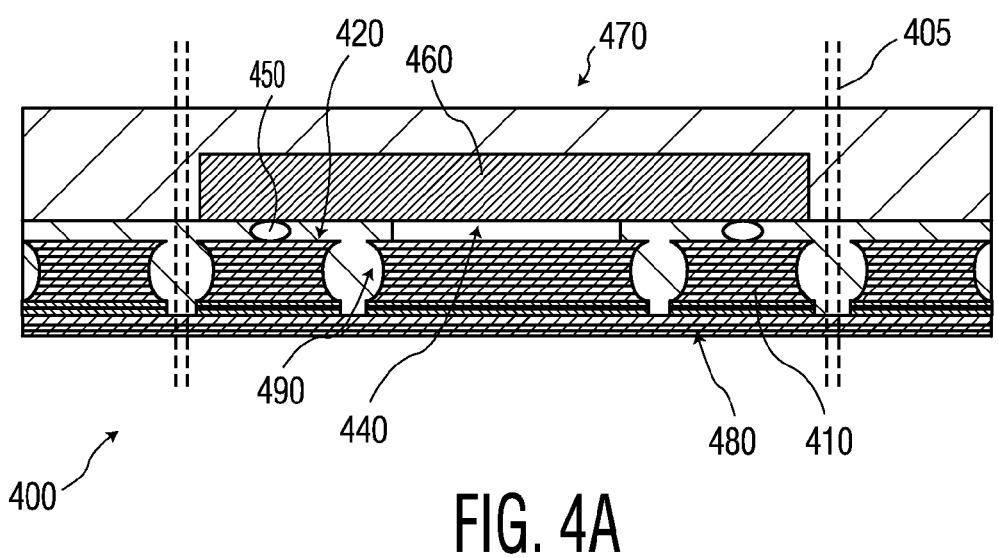
FIGS. 4A-4B depicts in cross-section the packaging of a flip-chip die in a lead frame having recesses, the recesses providing mechanical attachment to laminating material according to an embodiment of the present invention.
Figure 4B:
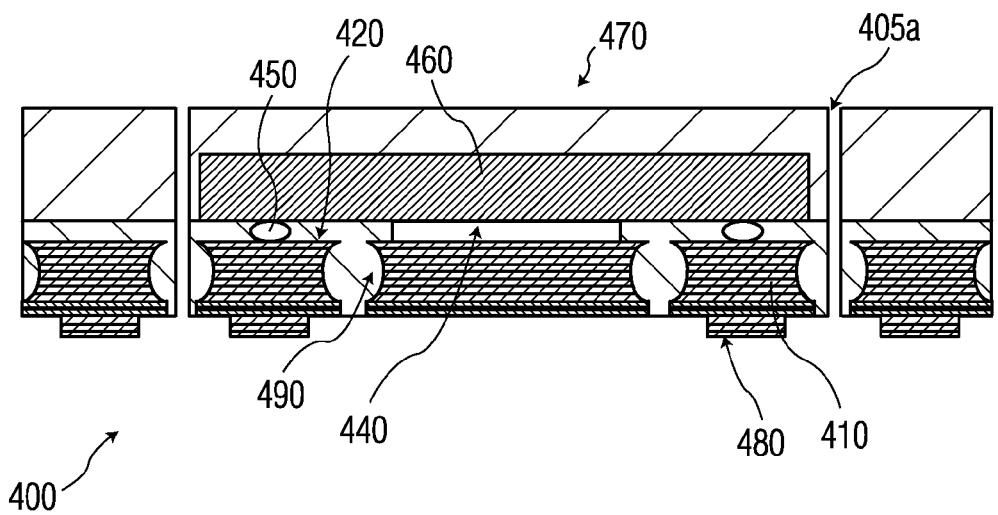

Refer to FIG. 4A and FIG. 4B. In another example embodiment according to the present invention, a packaged device 400 (delineated by boundaries 405) includes recesses 490 to ensure that the laminating material 420 is firmly anchored to the lead frame 410. The curved shape of these recesses 490 is defined by selectively etching the lead frame 410 by, for example, by the method as cited in Kloen et al. The modified lead frame 410 recesses 490 provide for enhanced mechanical strength between the lead frame 410 and laminating material 420. The air-cavity 440 may be defined with the method outlined supra. The device die 460 is ball bonded 450 to the lead frame 410 and sealed with encapsulating material 470. After encapsulation, multiple packaged devices 400 are separated at boundaries 405a. After encapsulation, lead frame 410 is back etched and the resulting structure of 4B remains having electrical connections 480.

While the present invention has been described with reference to several particular example embodiments, those skilled in the art will recognize that many changes may be made thereto without departing from the spirit and scope of the present invention, which is set forth in the following claims.

What is claimed is:

1. A method for manufacturing a semiconductor device in an air-cavity package, the semiconductor device including a device die, the device die having an active circuit surface and a back surface, the active circuit surface having bond pads, the method comprising:
   providing a lead frame, the lead frame having a top-side surface and an under-side surface, the lead frame having predetermined pad landings on the top-side surface;
   applying a laminate material to the top-side surface of the lead frame;
   defining an air-cavity region and contact regions in the laminate material, the contact regions situated over and providing electrical connections to the predetermined pad landings on the lead frame; and
   mounting the device die with the active circuit surface in an orientation toward the laminate material, connecting the bond pads of the active circuit surface with ball bonds to the predetermined pad landings on the lead frame, the active circuit surface of the device die and the top-side surface of the lead frame forming an air-cavity therebetween.

2. The method as recited in claim 1, further comprising the step of, encapsulating the device die with a passivating envelope.

3. The method as recited in claim 2, wherein the lead frame further includes recesses, the recesses providing mechanical connection for at least one of the following: the laminate material and the encapsulating material.

4. The method as recited in claim 3, wherein the laminate material is photo-sensitive, and the defining the air-cavity region and contact regions further comprises,
   masking the laminate material to define the air-cavity region and contact regions;
   exposing the laminate material;
   etching away exposed areas in the laminate material; and
   cleaning the lead frame and laminate material structure.

5. The method as recited in claim 1, wherein the defining the air-cavity region and contact regions further comprises,
   applying a photo resist on the laminate material;
   masking the photo resist to define the air-cavity region and contact regions;
   exposing the photo resist;
   etching away exposed areas in the laminate material; and
   cleaning the lead frame and laminate material structure.

6. The method as recited in claim 5, further comprising, etching the underside surface of the lead frame such that electrical connections are made corresponding to contact regions providing electrical connections to the predetermined pad landings on the lead frame.

7. The method as recited in claim 1, wherein the predetermined pad landings have integral ball bonds defined thereon.

8. An array of semiconductor devices packaged according to the method as recited in claim 1.

9. A semiconductor device comprising:
   a carrier having boundaries with a first and a second side situated opposite to each other, the carrier having a first conductive layer on the first side, the first conductive layer is patterned in a predetermined pattern, thereby defining a number of mutually isolated connection conductors, wherein on the second side, contact surfaces are defined in the connection conductors for placement on a substrate;
   a layer of laminating material on the first side of the carrier, the laminating material having contact regions situated over and corresponding to the number of mutually isolated connection conductors and the layer of laminating material having an air cavity region defined therein;
   wherein a device die is situated over the air cavity region of the layer of laminating material, the device die having bonding pads electrically coupled with bumps to the connection conductors of the carrier through the contact regions, the bumps also attaching the device die onto the carrier, the layer of laminating material extending as far as the carrier boundaries;
   wherein the layer of laminating material is mechanically anchored in side faces having recesses defined in the connection conductors;
   the device die being encapsulated in a passivating envelope that extends as far as the carrier boundaries over the layer of laminating material, the passivating envelope bonding to the layer of laminating material.

10. The semiconductor device as recited in claim 9, wherein in addition to the first conductive layer, the carrier further comprises a second layer and a third layer, the second layer comprising a material that can be etched in an etchant that leaves the first and third layer substantially intact.

11. The semiconductor device as recited in claim 10, wherein the first layer and the third layer contain copper, and the second layer contains a material selected from the group of aluminum and nickel-iron.

12. The semiconductor device as recited in claim 9, wherein the recesses extend from the first side as far as the second side of the carrier.

13. A method for packaging a plurality of device chips on a semiconductor wafer, the semiconductor device including a device chip, the device chip having an active circuit surface and a back surface, the active circuit surface having bond pads, the method comprising:

providing a plurality of lead frames, the lead frames having a top-side surfaces and under-side surfaces, the lead frames having predetermined pad landings on the top-side surfaces, the plurality of lead frames encompassing the plurality of device chips on the semiconductor wafer, the plurality of lead frames having boundary regions defining single packaged devices;

applying a laminate material to the top-side surface of the plurality of lead frames;

defining air-cavity regions and contact regions in the laminate material, the contact regions situated over and providing electrical connections to the redetermined ad landings on the lead frames;

mounting the semiconductor substrate having the plurality of device chips with the active circuit surfaces in an orientation toward the laminate material, connecting the bond pads of the active circuit surfaces with ball bonds to the predetermined pad landings on the lead frames, the active circuit surfaces of the device chips and the top-side surfaces of the lead frames forming air-cavities therebetween;

map molding the semiconductor substrate with a passivating envelope;

back etching the underside surfaces of the plurality of lead frames so that electrical connections remain; and separating the plurality of device chips at the boundary regions.

14. The method as recited in claim 13, wherein the lead frames further include side faces, the side faces having recesses facilitating the mechanical anchoring of the laminate material applied to the lead frames.

* * * * *